United States Patent
Maleville

(10) Patent No.: US 7,297,611 B2
(45) Date of Patent: Nov. 20, 2007

(54) METHOD FOR PRODUCING THIN LAYERS OF SEMICONDUCTOR MATERIAL FROM A DONOR WAFER

(75) Inventor: Christophe Maleville, La Terrasse (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 382 days.

(21) Appl. No.: 11/084,748

(22) Filed: Mar. 21, 2005

(65) Prior Publication Data

US 2005/0164471 A1    Jul. 28, 2005

Related U.S. Application Data

(63) Continuation of application No. PCT/IB2004/002969, filed on Aug. 11, 2004.

(30) Foreign Application Priority Data

Aug. 12, 2003   (FR) .................................. 03 09885

(51) Int. Cl.
*H01L 21/46*   (2006.01)
*H01L 21/30*   (2006.01)

(52) U.S. Cl. ............... 438/458; 438/455; 257/E21.568; 257/E21.57

(58) Field of Classification Search .............. 438/455, 438/458; 257/E21.568, E21.57
See application file for complete search history.

(56) References Cited

U.S. PATENT DOCUMENTS

| | | | |
|---|---|---|---|
| 5,374,564 A | 12/1994 | Bruel | 438/455 |
| 5,856,229 A | 1/1999 | Sakaguchi et al. | 438/406 |
| 6,566,158 B2 | 5/2003 | Eriksen et al. | 438/53 |
| 6,569,748 B1 | 5/2003 | Sakaguchi et al. | 438/455 |
| 6,613,678 B1 | 9/2003 | Sakaguchi et al. | 438/695 |

*Primary Examiner*—Asok Kumar Sarkar
(74) *Attorney, Agent, or Firm*—Winston & Strawn LLP

(57) ABSTRACT

A method for producing thin layers of a semiconductor material from a donor wafer, which comprises in succession forming a first weakened region in a donor wafer below a first face and at a depth corresponding substantially to the thickness of a first thin layer to be transferred, detaching the first thin layer having upper and lower boundaries defined by the first face and the first weakened region, forming a second weakened region in the donor wafer after detachment of the first thin layer and without conducting an intermediate recycling step, with the second weakened region formed below a second face of the donor wafer and at a depth corresponding substantially to the thickness of a second thin layer to be transferred, and detaching the second thin layer having upper and lower boundaries defined by the second face and the second weakened region. Resultant semiconductor-on-insulator structures are also included.

20 Claims, 2 Drawing Sheets

METHOD FOR PRODUCING THIN LAYERS OF SEMICONDUCTOR MATERIAL FROM A DONOR WAFER

CROSS-REFERENCE TO RELATED U.S. APPLICATION

This application is a continuation of PCT/IB2004/002969, filed Aug. 11, 2004, the contents of which is hereby incorporated herein by express reference thereto.

FIELD OF THE INVENTION

The present invention relates to a method for producing thin layers of semiconductor material from a so-called donor wafer, and resultant semiconductor-on-insulator structures.

BACKGROUND

Known methods, in particular of the SMART-CUT® type (as described especially in U.S. Pat. No. 5,374,564) or the like, make it possible to take a semiconductor thin layer from a donor wafer.

These methods are principally based on the use of two steps:

1) formation of a weakened zone or region below one face of the wafer, at a depth corresponding substantially to the thickness of a thin-layer to be transferred to a substrate, 2) detachment of the thin layer from the wafer at the level of the weakened region, the thin layer being the part of the wafer lying on the side of the weakened region next to the face on the detachment side.

This two-step method is generally preceded by a step of preparing or recycling the wafer, which is intended to achieve a surface roughness correction in order to improve the planarity of at least the face of the wafer on the detachment side, but this recycling operation does not generally correct the roughness sufficiently to achieve the manufacturer's specifications for the thin-layer, given that these prerequisite roughness specifications are established with a view to ensuring good subsequent bonding of the detached thin layer onto a support or another layer, and/or in order to finally obtain a layer with a thickness uniform enough to provide a high-quality structure, especially in the case of very thin layers such as in conventional Silicon On Insulator ("SOI") structures.

A finishing step for roughness correction is therefore normally carried out on the face of the donor wafer on the detachment side to correct the excessive residual roughness after the recycling step so as to comply with the specifications.

The two-step detachment method is then carried out at the face whose roughness was corrected during the finishing step, in order to provide on the one hand a thin layer, optionally bonded onto a support, and on the other hand the donor wafer reduced by the thickness of the thin layer.

This donor wafer can then be reused for the fabrication of a second thin layer after subjecting it to another step of recycling and surface correction.

Although this type of method has provided genuine progress in the fabrication of thin layers, and especially in the fabrication of SOI structures, it is still desirable to improve it, especially in terms of efficiency, speed and fabrication cost, and in particular to reduce the number of fabrication steps.

It would thus be useful to substantially reduce the number of recycling steps required. For example, it would be conceivable to form a weakened region on each of the faces of the donor wafer, then to detach two thin layers simultaneously, as proposed for example in U.S. Pat. Nos. 6,613,678 and 5,856,229, thus avoiding intermediate recycling between two detachments.

Such double implantation followed by such double detachment, however, involves extra technical working difficulties such as the need to turn the donor wafer over in order to form the second weakened region, thus increasing the risk of contamination and electrical and mechanical damage, the need for large and expensive equipment to bond two receptor wafers simultaneously onto the two faces of the donor wafer, and more difficult coordination of the various working steps since both the handling and processing tasks are increased at the same time.

For these reasons, these latter methods do not constitute technical progress in relation to the former ones, but instead lead to undesirable extra technical difficulties.

SUMMARY OF THE INVENTION

The invention encompasses a method for producing thin layers of a semiconductor material from a donor wafer in the absence of an intermediate recycling step, by conducting the following in succession: forming a first weakened region in a donor wafer below a first face and at a depth that corresponding substantially to the thickness of a first thin layer to be transferred, detaching from the donor wafer a first thin layer having upper and lower boundaries defined by the first face and the first weakened region, forming a second weakened region in the donor wafer after detachment of the first thin layer and without conducting an intermediate recycling step, with the second weakened region formed below a second face of the donor wafer and at a depth corresponding substantially to the thickness of a second thin layer to be transferred, and detaching from the donor wafer a second thin layer having upper and lower boundaries defined by the second face and the second weakened region.

In one embodiment, the first and second thin layers are located on opposite sides of the donor wafer. In another embodiment, the method further includes recycling the donor wafer after detaching the second thin layer for surface finishing of any remaining portions of the first and second thin layers that were not detached to thus prepare the donor wafer for reuse. In a preferred embodiment, the recycling includes simultaneous double-sided polishing of the opposite sides of the donor wafer.

In one embodiment, the method further includes bonding the donor wafer to a target substrate at its first face between forming the first weakened region before detaching the first thin layer, and subsequently bonding the wafer to a second target substrate before detaching the second thin layer.

In yet another embodiment, the method further includes, prior to forming the second weakened region, inspecting the second face of the donor wafer to confirm that it has a surface roughness that is sufficient to facilitate transfer of the second thin layer. In a preferred embodiment, the second face of the donor wafer is on an opposite side of the wafer from the first face. In another preferred embodiment, the method further includes surface finishing the second face of the donor wafer when the inspection shows that the second face does not has a surface roughness that is sufficient to facilitate transfer of the second thin layer. In a more preferred embodiment, the surface finishing includes at least one of mechanical polishing, chemical-mechanical polishing, sacrificial oxidation, chemical etching, plasma-assisted chemical etching, and annealing in an inert atmosphere.

In another embodiment, the method further includes forming an insulating layer on either the first face or second face of the donor wafer, or on both faces, before detaching the first thin layer. In a preferred embodiment, the insulating layer includes of (a) $SiO_2$ formed by thermal oxidation of a silicon surface or by deposition of $SiO_2$ or (b) $SiO_xN_y$, wherein x is 0 to 3 and y is 0 to 4 but x and y are not both 0.

In another embodiment, the first or second weakened region, or both regions, are formed by implantation of atomic species through the respective face of the donor wafer to define the thickness of the associated thin layer. In a preferred embodiment, the first or second weakened region, or both regions, are formed by porosification of a respective surface layer of the donor water followed by depositing semiconductor material by chemical vapor deposition on the porosified layer to form the associated thin layer.

In yet another embodiment, detachment of the first or second thin layer, or both, is carried out by providing a sufficient input of thermal, mechanical, or chemical energy, or a combination thereof. In a preferred embodiment, the thermal energy includes a heat treatment at a temperature of about 300° C. to 500° C., the mechanical energy includes forces exerted on the wafer sufficient to cause detachment, or the chemical energy includes anodizing an initial wafer surface to form a porous semiconductor layer on each surface thereof.

In another embodiment, the method further includes finishing at least one surface of the donor wafer before the forming the first weakened region. In a preferred embodiment, the surface finishing can be the same or different as those noted above.

In another embodiment, each of the first and second thin layers is selected to have a thickness of about 100 nm to 1 micron.

BRIEF DESCRIPTION OF THE DRAWINGS

Other aspects, objects and advantages of the present invention will become more readily apparent on reading the following detailed description of a preferred embodiment of it, which is given by way of a nonlimiting example and with reference to the appended drawings, in which.

Figure 1A:
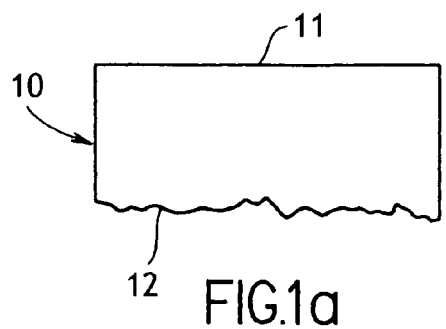
FIGS. 1a to 1h describe step-by-step a method for producing two thin layers according to the invention.

It will be noted here that the drawings represented by FIGS. 1a to 1i are schematic and do not reflect the true situation in terms of spatial scales, as they have been produced with the sole aim of optimally explaining the principle of a method according to the invention.

DETAILED DESCRIPTION OF THE PREFERRED EMBODIMENTS

The present invention can advantageously produce thin layers of a semiconductor material from a donor wafer, which includes in succession forming a first weakened region or weakened zone in the wafer below a first of its faces and at a depth corresponding substantially to a thin-layer thickness, then detaching a first thin layer from the wafer at the level of the first weakened region, the first thin layer being the part of the wafer lying on the side of the first weakened region next to the first face, then forming a second weakened region in the wafer below the second of its faces and at a depth corresponding substantially to a thin-layer thickness, and then detaching a second thin layer from the wafer at the level of the second weakened region, the second thin layer being the part of the wafer lying on the side of the first weakened region next to the second face. In a preferred embodiment, the method avoids intermediate recycling.

Some preferred, but optional, aspects of the inventive method include one or more of the following embodiments. The donor wafer can be recycled after having been used during previous thin-layer production and before forming the first weakened region, and the method furthermore can includes at least one finishing of the surface condition of this recycled donor wafer before the initial forming of the first weakened region. Also, the donor wafer can be recycled after detaching the second thin layer, followed by finishing the surface condition of the donor wafer so that the wafer can be reused during subsequent production of additional thin layers. Preferably, the optional recycling step includes the use of double-sided polishing. The finishing, or polishing, can include one or more of the following techniques: mechanical polishing, chemical-mechanical polishing, sacrificial oxidation, chemical etching, plasma-assisted chemical etching, or annealing in an inert atmosphere.

The method can further include one or two additional respective steps: bonding the donor wafer between forming the first weakened region and detaching of the first thin layer and forming the second weakened region and detaching the second thin layer, respectively at its first and second faces, onto two respective target substrates. Preferably, one or more insulating layers can be formed on the wafer before the detaching of the first thin layer. The insulating layer(s) preferably includes $SiO_2$, typically as a layer formed by thermal oxidation of a silicon surface, or by deposition of $SiO_2$.

The formation of at least one weakened region in the donor wafer is generally carried out by implantation of atomic species through a respective face of the wafer at the desired depth of the weakened region. Preferably, the formation of the at least one weakened region is carried out by porosification of a surface layer of the material of the donor wafer, and the associated thin layer is formed by semiconductor material deposition on the porosified layer.

When detaching the thin layers from the donor wafer, at least one of the thin-layer detachments is carried out by providing energy to the thin layer(s). Preferably, before detachment of the second thin layer, the inventive method also includes inspecting the quality of the second face of the wafer, and if the inspected quality of the second face of the wafer is less than a minimum acceptable quality value, carrying out a step of correcting the quality of the said second face.

The insulating layer preferably forms a bonding interface layer, and the finishing typically includes removal of the insulating layer or removal of the oxidized layer followed by thickness correction of the second face if needed following the quality inspecting. The finishing of the surface is preferably followed by re-forming the insulating layer on the wafer before further processing. The re-forming and finishing processes can be accomplished by the same or different processes as the initial forming of the insulating layer and any other finishing processes. The method also preferably includes recycling the wafer for further use after detaching the second thin layer.

In one embodiment, at least one of the thin-layer detachment steps is carried out by a sufficient input of energy provided thermally, mechanically, or chemically, or a combination thereof. In a preferred embodiment, the thermal energy includes heat treatment to a temperature of about 300° C. to 500° C., the mechanical energy includes forces exerted on the wafer, or the chemical energy includes anodizing an initial wafer surface to form of a porous semiconductor layer on each surface thereof.

The present invention also relates to the application of the method as defined above to produce semiconductor-on-insulator structures.

In another embodiment, it has now been discovered that multiple thin layers of semiconductor materials can be prepared from a single zone of a donor wafer and used to provide silicon-on-insulator structures according to the invention. This is advantageously achieved by forming a first weakened region in the wafer below a first face and at a depth corresponding substantially to the thickness of a thin layer to be transferred, detaching a first thin layer from the wafer at the level of the first weakened region, the first thin layer being the part of the wafer lying on the side of the first weakened region next to the first face, forming a second weakened region in the wafer below a second face and at a depth corresponding substantially to a thin-layer thickness, and detaching a second thin layer from the wafer at the level of the second weakened region, the second thin layer being the part of the wafer lying on the side of the first weakened region next to the second face. The inventive method can advantageously substantially reduce or avoid the need for intermediate recycling of the wafer to prepare for further processing, and can also avoid the need for concurrent processing of two different, typically opposing, surfaces of the wafer. The recycling avoided during wafer processing includes avoiding the need to remove the insulating layer, avoiding finishing of the wafer surface, or both. Rather, any recycling occurs before or after the forming of weakened zones and detachment of thin layers of wafer. The initial forming of a weakened region and then detaching of a first thin layer followed by the forming of a second weakened region and detaching of a second thin layer preferably occur in succession, rather than concurrently, to facilitate removal of multiple thin layers of semiconductor materials from a donor wafer.

The invention also encompasses the embodiments set forth below by referring to the attached drawings. Referring to FIG. 1a, a donor wafer 10 of semiconductor material, such as monocrystalline silicon, has faces 11 and 12 from which thin layers are to be successively removed according to the invention. The wafer 10 has a typical thickness of about a few tens of microns and a few millimeters.

The faces 11 and 12 of the wafer 10 have the typical characteristics of a wafer which is "fresh," or in the raw state, that is to say a wafer which has not been used since its fabrication. In an embodiment where the wafer is not "fresh," any available recycling procedure can be used before beginning the forming and detaching of the thin layers of the claimed invention.

FIG. 1a represents a wafer 10 in the raw state, which has characteristics customarily encountered after fabrication, namely a low average roughness on its front face (face 11 in FIG. 1a) and a large average roughness on its rear face (face 12 in FIG. 1a). The average rear-face roughness is typically greater in the case of medium-size wafers (having for example a typical diameter of 200 mm) than in the case of larger-sized wafers (having for example a typical diameter of 300 mm).

In one particular configuration of the wafer 10 (not shown), the wafer may nevertheless have other characteristics such as two faces 11 and 12 each having a large average roughness (for example after having undergone grinding and lapping operations). The two faces 11 and 12 may in this case be rectified during a recycling step, for example, by carrying out double-sided polishing at the same time before any formation of weakened regions and detachment of any layers of the donor wafer.

In another particular configuration of the wafer 10 (not shown), it has two faces 11 and 12 with a low average roughness (i.e., close to or meeting the specifications necessary for good bonding of the wafer to additional materials such as an insulating layer).

The face 11 of the donor wafer 10 may then be flat enough to comply with the customary specifications, in terms of surface condition, so that a thin layer taken from the wafer can then be bonded properly onto a support or the like and/or in order to finally have a thin layer which has a sufficiently uniform thickness. These specifications relate inter alia to the surface roughness, and they usually depend on the thickness of the thin layers to be produced.

For instance, these specifications generally stipulate a maximum acceptable value of surface roughness, below which the surface condition of these faces 11 and 12 must lie in order to be able to start the process of forming thin layers as described below. The maximum surface roughness value is usually defined by a roughness standard deviation value or "RMS" value (standing for "Root Mean Square") determined on the basis of roughness measurements taken using an atomic force or AFM microscope (standing for "Atomic Force Microscopy"). The maximum acceptable value of the roughness is typically an RMS roughness of about 5 angstroms, measured in a region measuring 1 micron by 1 micron on the surface of the layer. Preferably the roughness is less than about 3 angstroms, and in a preferred embodiment is less than about 1 angstrom.

Figure 1B:
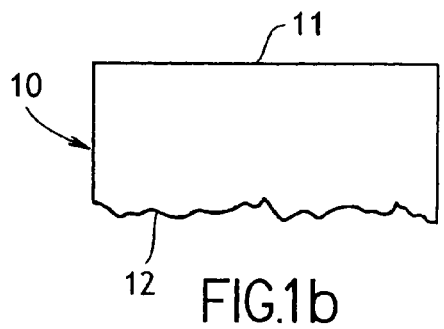

In the majority of cases, and especially when a particularly thin layer is to be formed subsequently from the wafer 10, the surface roughness of the wafer 10 is still too great compared with this acceptable value, and it is therefore expedient to carry out a step of finishing the surface condition of the face 11 of the wafer 10. This finishing step is typically carried out by using a fine roughness correction so as to finally comply with the specifications stipulated by the manufacturer. Several techniques which may be used for this finishing step will be described below. The wafer 10 after the finishing step is illustrated in FIG. 1b.

Figure 1C:
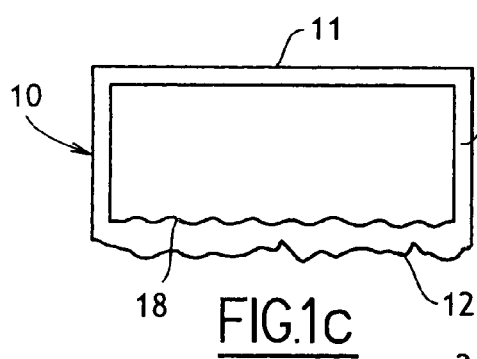

Referring to FIG. 1c, the roughness of the first face 11 now being acceptable for the formation of thin layers, an insulating layer 13 can be formed on the donor wafer 10. For example, an insulating layer 13 of $SiO_2$ may be formed by conventional techniques, such as thermal oxidation of a silicon surface or deposition of $SiO_2$. A donor wafer 10 covered with an insulating layer 13 of $SiO_2$ is then obtained. This insulating layer 13 may include any suitable insulating material other than or in addition to $SiO_2$, for example $Si_3N_4$ (the insulating layer 13 then being formed, for example, by nitriding a silicon surface of the donor wafer 10) or $SiO_xN_y$. Preferably, x=0 to 3 and y=0 to 4. In preferred embodiments, x or y is 0 while the other is greater than 0.

The formation of the insulating layer 13 at the level of the second face 12 of the donor wafer 10 is generally accompanied by attenuation of the average roughness under the insulating layer 13, at the level of the interface 18 with the underlying semiconductor material. This can occur because the formation of the insulating layer 13 generally has a property of smoothing, or decreasing, the average surface roughness of one or more surfaces of the donor wafer 10. For example, oxidation of the second face 12 attenuates its roughness commensurately more when the thickness of the insulating oxide layer 13 being formed is large; this property is moreover used in some applications solely as a smoothing technique, referred to as the technique of "sacrificial oxidation."

Figure 1D:
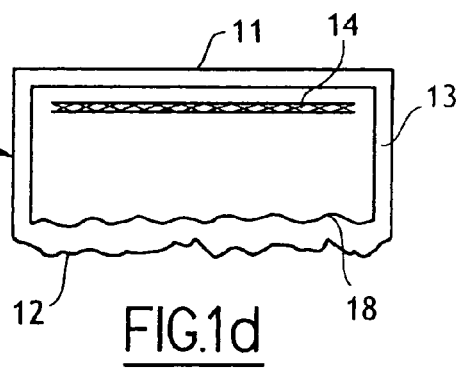

Referring to FIG. 1d, a first weakened region 14 of the wafer 10 is then formed below the first face 11, preferably at a depth corresponding substantially to the thickness of the thin layer that is intended to be obtained.

A thin layer produced using the present inventive method preferably has a thickness of about 100 nm to 25 micron. In one preferred embodiment, the thin-layer thickness, and depth of the formation of the weakened region is at a depth of about 500 nm to 5 micron. A preferred maximum thickness is about 1 micron.

A "weakened region" is defined as having weaker and/or fewer inter-atomic bonds than those found in the rest of the wafer 10, preferably substantially weaker and/or fewer inter-atomic bonds to facilitate separation of a portion of the donor wafer at least in part along a zone within or adjacent to this weakened region. It is therefore a region that tends to fracture more easily and typically before the rest of the wafer 10 when sufficient external energy is applied. The weakened region 14 is advantageously substantially flat, substantially parallel, or both, compared to the plane defined by the face 11. Preferably, the weakened region 14 is substantially flat and substantially parallel to the face 11.

Figure 1E:
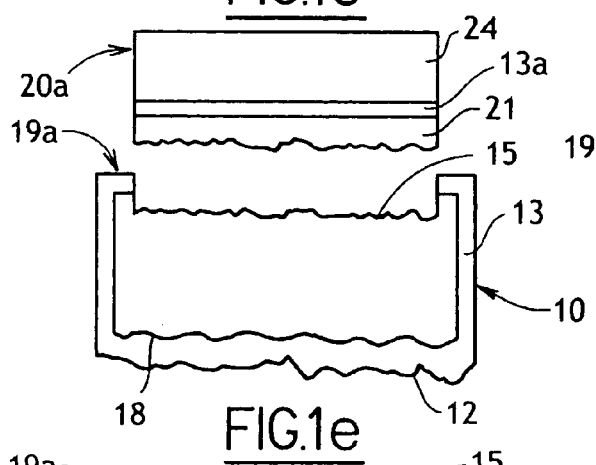

Although any suitable manner of successively removing two layers of the wafer may be achieved according to the invention, there are two preferred ways of producing the weakened region 14 as described herein. Referring now to FIG. 1e for the first way, a first thin layer 21 is detached from the wafer 10 at the level of the weakened region 14, the thin layer 21 being the part of the wafer lying between the face 11 and the weakened region 14.

The detachment of the thin layer 21 is typically and preferably performed after having previously carried out bonding between the face 11 optionally provided with the insulating layer 13a (which forms a bonding interface) and a target substrate 24.

In the event that the bonding-interface insulating layer 13a is present on the first thin layer 21 and/or an insulating layer is present on the target substrate 24, heat treatment can advantageously be carried out in order to reinforce the bonding.

A structure 20a including the target substrate 24, an insulating layer 13a and the detached first thin layer 21 is then obtained.

If the detached first thin layer 21 is made of silicon and if the insulating layer 13 is thick enough to provide sufficient electrical insulation between the first thin layer 21 and the target substrate 24, then a "silicon on insulator" (SOI) structure 20a is obtained.

In all cases, the detached first thin layer 21 may then be corrected at the detached interface for thickness, surface roughness, or both. This can be achieved by any suitable means, particularly one or more treatments including mechanical polishing, chemical-mechanical planarization (CMP), sacrificial oxidation, chemical etching, plasma-assisted chemical etching, and annealing in an inert atmosphere (particularly in hydrogen).

The donor wafer 10 remaining after the first detachment has, according to the conventional detachment techniques, a ring 19a on its first face 11 substantially constituting the negative counterpart of the detached first thin layer 21.

Before forming a second weakened region 17, as will be described with reference to FIG. 1f, an operation of inspecting the surface condition of the face 12 of the donor wafer is advantageously carried out, including a measurement or evaluation of the quality of the surface, particularly in order to ascertain and ensure the integrity of the surface before further processing. For instance, it is possible to measure the roughness and detect the presence or absence of scratches, downgrading defects, contaminants or isolated particles.

Figure 1F:
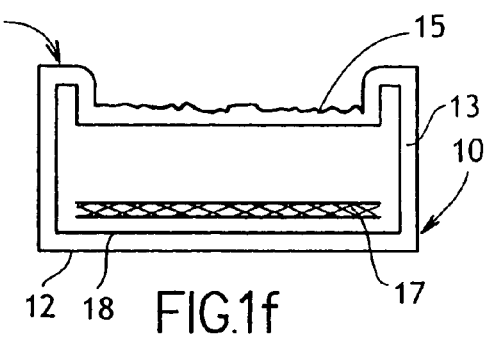

In the event that this measurement gives a quality complying with the specifications, and therefore making it possible to detach a second thin layer on the same side as this face 12, the formation of this second thin layer is then carried out according to the invention as illustrated in FIG. 1f. Conversely, in the event that this measurement gives an insufficient quality in relation to the specifications, e.g., because of defects (particulate contamination, minor scratches, etc.) created during the production of the first thin layer 21, or because of roughness initially present on the second face 12 (see FIG. 1a), a second finishing step is then carried out in order to correct the surface condition of the face 12 and in particular to bring the roughness value to within the specifications.

This second finishing can be carried out by any of the suitable methods available for the first finishing. Preferably, the second finishing is carried out by the same technique as the first finishing.

In this second exemplary case, and in the particular case when an insulating layer 13 is present on the surface of the wafer 10, this finishing for roughness correction may include, e.g., removal of the insulating layer 13 or removal of the insulating layer 13 followed by thickness correction of the face 12 exposed in this way (which is in fact the interface 18 represented in FIG. 1e).

The choice will be readily selected by those of ordinary skill in the art taking into consideration the extent of the roughness defects or other defects on the face 12, as revealed by the aforementioned inspecting operation.

The removal of the insulating layer 13 is preferably carried out by chemical means, and in particular using corrosion by an acidic agent. A preferred acidic agent includes hydrofluoric acid in the case of a thin layer 21 of silicon. Other suitable acidic agents may be used separately or in conjunction with hydrofluoric acid. The surface of the wafer 10 may then be re-oxidized after the finishing, if an insulating layer 13 is intended to be present to form a bonding interface.

A high-quality second face 12 is then obtained, in particular one being substantially free or entirely free of roughness, as illustrated in FIG. 1f.

This finishing of the second face 12, subsequently making it possible to carry out a second layer detachment (thin layer 22 with reference to FIG. 1g) from the donor wafer 10, is simpler to carry out than a standard step of recycling the first face 11 after the said first detachment, which might be carried out in order to prepare it for a second layer detachment as is the case in the prior art.

Specifically, in contrast to recycling, which is avoided during the successive formation and detachment procedures, the finishing according to the invention treats a surface 12 in which the roughness is buried (i.e. interface 18), there are no discontinuities at the edge, such as those of the ring 19a on the face 11 after detachment, the planarity is most often better at the level of the insulating layer 13, after its removal, than in the case of the surface 15 after the first detachment, in particular because of the natural smoothing provided by the operation of forming the insulating layer 13 (as explained above).

However, in an extreme case in which the surface condition of the face 12 requires an excessive amount of work, or excessively time-consuming work, to be compensated for by a finishing step, the wafer 10 is then sent for recycling. Yet if all the typical handling precautions have been taken, such an extreme case will occur very infrequently.

Referring to FIG. 1f, a second weakened region 17 is then formed in the wafer 10, below the second of its faces 12 and at a depth corresponding substantially to an intended thickness of the thin layer to be detached. The way in which this second weakened region 17 is formed may be the same as that used to form the first weakened region 14.

Figure 1G:
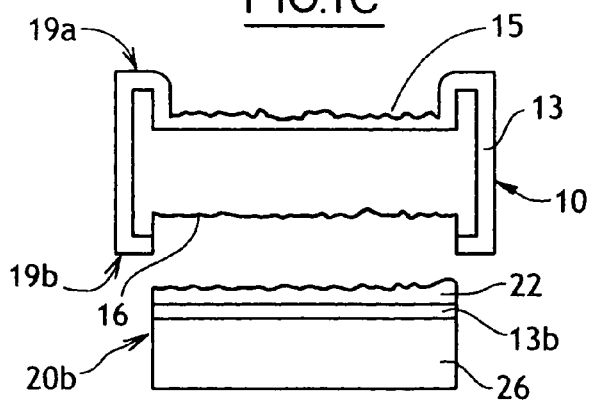

Referring to FIG. 1g, a second thin layer 22 is detached from the wafer 10 at the level of the second weakened region 17, the second thin layer 22 being the part of the wafer 10 lying substantially between the second face 12 and the second weakened region 17. The technique or techniques employed to detach this second thin layer 22 may be identical to that or those used to detach the first thin layer 21, with attachment to a second target substrate 26.

A second structure 20b including the second target substrate 26, an insulating layer 13b and the detached second thin layer 22 is then obtained. The way in which the surface condition of the second thin layer 22 is treated may be the same as the way in which the surface of the first thin layer 21 is treated, or this treatment may be different. The donor wafer 10 remaining after the first detachment has, according to the conventional detachment techniques, a ring 196a on its second face 12 substantially constituting the negative counterpart of the detached second thin layer 22.

The method according to the invention therefore makes it possible to produce two thin layers 21 and 22 from the same donor wafer 10, without the latter needing to be subjected to an intermediate recycling step, given that such recycling always slows the rates of fabrication, sometimes significantly, and in particular when the wafer needs to be transported to a recycling site that may be geographically or physically separate from the site where the thin layers are detached. Merely a simple finishing step is optionally carried out, involving a minor roughness correction, however, the delay is significant.

Figure 1H:
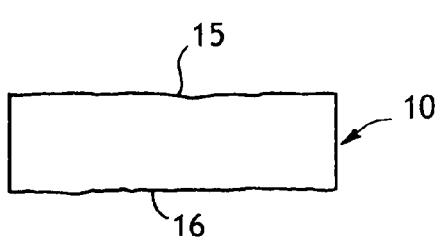

Referring to FIG. 1h, the wafer 10 reduced by the thicknesses of the thin layers 21 and 22 may be subjected to a recycling step during with the roughnesses of its new faces 15 and 16 being corrected, so that the method can be repeated and two new thin layers can be produced before the next recycling.

In particular, double polishing may then be carried out (that is to say polishing which affects both the faces 15 and 16 of the donor wafer 10, preferably simultaneously) in order to carry out rapid recycling of the donor wafer 10.

Preferred techniques for technical implementation of the method according to the invention will now be described. A first preferred way of producing the weakened regions 14 and 17 involves a SMART-CUT® type process, as disclosed in U.S. Pat. No. 5,374,564, where species are implanted through the face 11 or the face 12 of the wafer 10, respectively, to the depth of the weakened region 14 or 17 corresponding at least substantially to the desired penetration depth of the species in the wafer 10.

The species in question are preferably ions, in particular hydrogen ions or boron ions, which are implanted by an ion bombardment machine or by a plasma machine.

In a preferred embodiment, and as described above, the insulating layer 13 is formed at the surface of the wafer 10 before implantation.

According to a variant of the invention, implantation of a second atomic species precedes the implantation that forms the weakened region 14 or 17. The main aim of this other implantation, preferably ion implantation, for example of hydrogen species or hydrogen, boron species, or both, is to create defects at the level of the future weakened region in order to trap the species that are implanted subsequently.

In another preferred embodiment, heat treatment is carried out during and/or after the implantation of the species, to accentuate the weakening of the donor wafer 10 at the level of its weakened region 14 or 17.

The detachment of the thin layer 21 or 22 is then carried out by input of energy produced thermally, preferably by means of heat treatment in a temperature range typically lying from about 300° C. to 500° C., preferably about 350° C. to 450° C. in the case of a thin layer 21 or 22 of silicon, and/or produced mechanically, preferably by means of mechanical forces exerted on the wafer 10.

A second way of producing the weakened region 14 or 17 includes the formation of a porous semiconductor layer on each surface of an initial wafer of crystalline material, for example by anodization. A layer of semiconductor material forming the thin layer 21 and 22 to be detached may then be produced by epitaxy on the porous layer, preferably by a "CVD" technique (standing for "Chemical Vapour Deposition"). The wafer 10 provided with the porous layer and the deposited layer 21 or 22 is then preferably oxidized at the surface in order to form the insulating layer 13, which will form a bonding interface layer during attachment to the target substrate.

The detachment of the thin layer 21 or 22 is preferably carried out by input of energy, preferably mechanical energy by means of a jet of fluid applied at the level of the weakened region 14 or 17, respectively, and in particular by means of a jet of liquid such as water.

Figure 2:
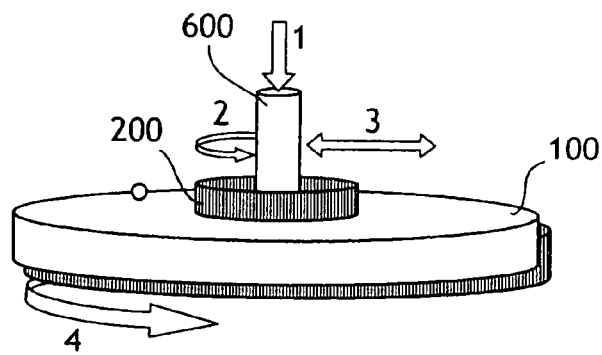
FIG. 2 represents a perspective view of the polishing or CMP device used in a method according to the invention.

Referring to FIG. 2, a device for carrying out a finishing or recycling step intended to correct the roughness of the faces 11 and 12 of the wafer 10 is represented. A polishing head 200 mounted on a rotary drive shaft 600 has a cavity capable of holding the wafer 10. A polishing plate 100, which can also be rotated, closes the cavity of the polishing head 200 by being pressed against it, so as to enclose the wafer 10 between the plate and the head. The polishing head 200 is advantageously covered with a fabric.

A force 1 applied to the polishing head along the shaft 600 brings the wafer 10 in contact with the internal face of the cavity of the head 200 and with the upper face of the plate 100. The respective rotational movements 2 and 4 of the head 200 and of the plate 100 with respect to the wafer 10 cause friction on its faces 11 and 12, and therefore polish these faces simultaneously. In a preferred embodiment, the polishing head 200 accompanied by the wafer 10 is moved over the upper surface of the polishing plate 100 along a specific path in order to optimally homogenize the polishing of the faces 11 and 12. This movement may, for example, be a movement in translation to-and-fro along a specific axis, or a combined movement in rotation and in translation (spiral movement).

Figure 3:
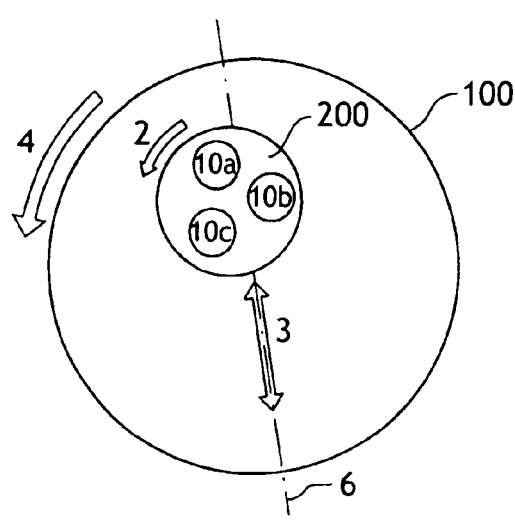
FIG. 3 represents a view from above of a polishing or CMP device used in a method according to the invention.

In another preferred version, it is possible to combine mechanical polishing, abrasion by injected abrasive particles (such as silica particles) and chemical etching, according to a so-called CMP method (standing for "Chemical-Mechanical Planarization"). In yet another embodiment, the polishing device includes a polishing head 200 which holds a plurality of wafers. A particular embodiment of this device is represented with reference to FIG. 3. This device is similar to the one in FIG. 2, with a polishing head 200 that can hold three wafers 10*a*, 10*b* and 10*c*.

In a preferred version, this polishing head 200 is moved with respect to the polishing plate 100 along a diametral axis 6 in a to-and-fro translational movement 3 which, in combination with the rotational movement of the polishing head 200, imparts respective spiral movements to the wafers 10*a*, 10*b* and 10*c* with respect to the polishing plate 100, thus polishing the faces 11 and 12 of each wafer homogeneously at the surface.

Figure 4:
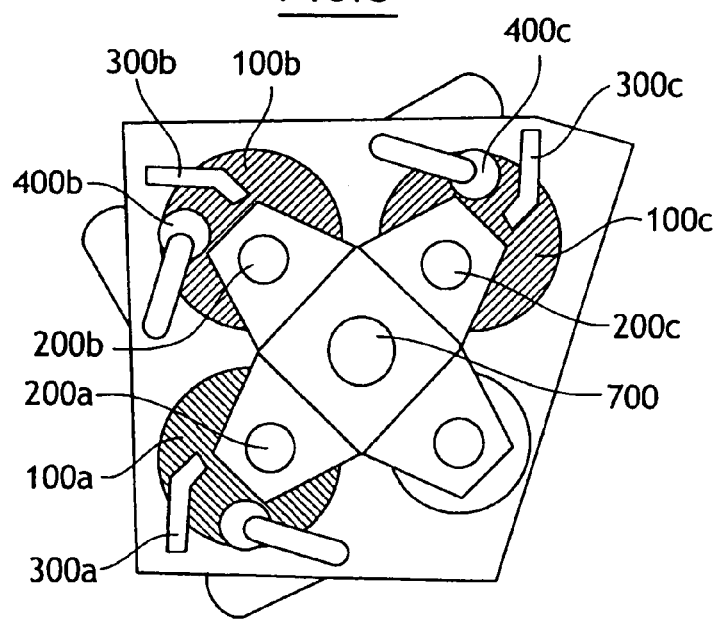
FIG. 4 represents a view from above of a CMP device used in a method according to the invention.

With reference to FIG. 4, another chemical-mechanical planarization device for carrying out the finishing step is represented. This device has three polishing plates 100*a*, 100*b* and 100*c* and three fluid injectors 300*a*, 300*b* and 300*c*. Three polishing heads 200*a*, 200*b*, 200*c*, which are connected together, are separated by an equal distance from a rotary shaft 700 and can move with respect to it.

The polishing plates 100*a*, 100*b* and 100*c* are preferably and respectively in contact with three brushing devices 400*a*, 400*b*, 400*c* so that surface residues can be removed regularly from the plates.

In one version of this device, the plate 100*a* and the head 200*a* take care of polishing the faces 11 and 12 of a wafer 10 in the same way as that explained in FIG. 2. In addition to this mechanical polishing, the injector 100*a* may deliver a corrosive agent making it possible to carry out chemical etching, or alternatively an abrasive agent making it possible to carry out mechanical etching.

The polishing head 100*a* then brings the wafer 10 level with the second polishing plate 100*b*, and finally level with the third polishing plate 100*c*, by virtue of a rotational movement of the head 100*a* around the shaft 700, in order to carry out respective processes of cleaning the surface of the wafer 10 with the aid of cleaning fluids injected through the injectors 300*b* and 300*c*.

Other mechanical or chemical-mechanical polishing methods may of course be used in order to carry out the roughness correction of the faces 11 and 12 of the wafer 10. In particular, mention may be made of sacrificial oxidation, chemical etching, plasma-assisted chemical etching, and annealing in an inert atmosphere, or any combination thereof.

The various methods described and mentioned above may in particular be used in a more elaborate way so as to carry out selective roughness correction, that is to say a different roughness correction on the faces 11 and 12 of the wafer 10, for example as a function of roughness measurements which have been carried out on these faces beforehand and which have detected some regions that are rougher than others, which may therefore be subjected to different and appropriate roughness corrections.

In one preferred embodiment, the invention encompasses a method for producing thin layers of a semiconductor material from a donor wafer in the absence of an intermediate recycling step, by successively forming a first weakened region in the wafer below a first face and at a depth corresponding substantially to a thin-layer thickness, forming an insulating layer on the wafer before detaching the first weakened region, then detaching from the wafer a first thin layer having upper and lower boundaries defined by the first face and the first weakened region, then forming a second weakened region in the wafer below a second face and at a depth corresponding substantially to a thin-layer thickness, and sufficiently finishing the second face to increase the quality thereof to a minimum acceptable quality value by a method that includes either removal of the insulating layer or removal of the insulating layer followed by correcting the thickness of the second face, and then detaching from the wafer a second thin layer having upper and lower boundaries defined by the second face and the second weakened region, wherein there is no intermediate recycling step between the forming the first weakened region and detaching the second thin layer.

The term "about," as used herein, should generally be understood to refer to both numbers in a range of numerals. Moreover, all numerical ranges herein should be understood to include each whole integer within the range.

The term "substantially free," as used herein, should be understood to mean that the component excluded has less than about 10 percent, preferably less than about 5 percent, and more preferably less than about 1 percent, of the undesirable component. Alternatively, referring to thicknesses, the term refers to the percentage of deviation from a planar surface. The term also includes the preferred embodiment, in which methods and articles of the invention contain at most a trace presence of the excluded component as an impurity. Most preferably, the methods and articles according to the present invention should be "entirely free" of the component or have a surface "entirely free" of roughness.

Although preferred embodiments of the invention have been described in the foregoing description, it will be understood that the invention is not limited to the specific embodiments disclosed herein but is capable of numerous modifications by one of ordinary skill in the art. It will be understood that the materials used and the chemical or processing details may be slightly different or modified from the descriptions herein without departing from the methods and compositions disclosed and taught by the present invention.

What is claimed is:

1. A method for producing thin layers of a semiconductor material from a donor wafer in the absence of an intermediate recycling step, which comprises in succession:
    forming a first weakened region in a donor wafer below a first face and at a depth corresponding substantially to the thickness of a first thin layer to be transferred;
    detaching from the donor wafer a first thin layer having upper and lower boundaries defined by the first face and the first weakened region;
    forming a second weakened region in the donor wafer after detachment of the first thin layer and without conducting an intermediate recycling step, with the second weakened region formed below a second face of the donor wafer and at a depth corresponding substantially to the thickness of a second thin layer to be transferred; and
    detaching from the donor wafer a second thin layer having upper and lower boundaries defined by the second face and the second weakened region.

2. The method of claim 1, wherein the first and second thin layers are located on opposite sides of the donor wafer.

3. The method of claim 2, which further comprises recycling the donor wafer, after detaching the second thin layer, for surface finishing of any remaining portions of the first and second thin layers that were not detached to thus prepare the donor wafer for reuse.

4. The method of claim 3, wherein the recycling comprises simultaneous double-sided polishing of the opposite sides of the donor wafer.

5. The method of claim 1, which further comprises bonding the donor wafer to a target substrate at its first face between forming the first weakened region before detaching the first thin layer, and subsequently bonding the wafer to a second target substrate before detaching the second thin layer.

6. The method of claim 5, which further comprises, prior to forming the second weakened region, inspecting the second face of the donor wafer to confirm that it has a surface roughness that is sufficient to facilitate transfer of the second thin layer.

7. The method of claim 6, wherein the second face of the donor wafer is on an opposite side of the wafer from the first face.

8. The method of claim 6, which further comprises surface finishing the second face of the donor wafer when the inspection shows that the second face does not have a surface roughness that is sufficient to facilitate transfer of the second thin layer.

9. The method of claim 8, wherein the surface finishing comprises at least one of mechanical polishing, chemical-mechanical polishing, sacrificial oxidation, chemical etching, plasma-assisted chemical etching, and annealing in an inert atmosphere.

10. The method of claim 1, which further comprises forming an insulating layer on at least either the first face or second face of the donor wafer, or on both faces, before detaching the first thin layer.

11. The method of claim 10, wherein the insulating layer comprises one of (a) $SiO_2$ formed by thermal oxidation of a silicon surface or by deposition of $SiO_2$ or (b) $SiO_xN_y$, wherein x is 0 to 3 and y is 0 to 4 but x and y are not both 0.

12. The method of claim 1, wherein the first or second weakened region, or both regions, are formed by implantation of atomic species through the respective face of the donor wafer to define the thickness of the associated thin layer.

13. The method of claim 12, wherein the first or second weakened region, or both regions, are formed by porosification of a respective surface layer of the donor water followed by depositing semiconductor material by chemical vapor deposition on the porosified layer to form the associated thin layer.

14. The method of claim 1, wherein detachment of the first or second thin layer, or both, is carried out by providing a sufficient input of thermal, mechanical, or chemical energy, or a combination thereof.

15. The method of claim 14, wherein the thermal energy comprises a heat treatment at a temperature of about 300° C. to 500° C., the mechanical energy comprises forces exerted on the wafer sufficient to cause detachment, or the chemical energy comprises anodizing an initial wafer surface to form a porous semiconductor layer on each surface thereof.

16. The method of claim 1 which further comprises finishing at least one surface of the donor wafer before the forming the first weakened region.

17. The method of claim 16, wherein the surface finishing comprises at least one of mechanical polishing, chemical-mechanical polishing, sacrificial oxidation, chemical etching, plasma-assisted chemical etching, and annealing in an inert atmosphere.

18. The method of claim 16, which further comprises forming an insulating layer on one or all wafer surfaces after the surface finishing.

19. The method of claim 18, wherein the insulating layer comprises one of (a) $SiO_2$ formed by thermal oxidation of a silicon surface or by deposition of $SiO_2$ or (b) $SiO_xN_y$, wherein x is 0 to 3 and y is 0 to 4 but x and y are not both 0.

20. The method of claim 1, wherein each of the first and second thin layers has a thickness of about 100 nm to 1 micron.

* * * * *